(12) United States Patent
Peterson et al.

(10) Patent No.: US 10,346,072 B1
(45) Date of Patent: Jul. 9, 2019

(54) DISLOCATED POWER LOSS PROTECTION CHARGE STORAGE

(71) Applicant: Amazon Technologies, Inc., Seattle, WA (US)

(72) Inventors: Phillip Peterson, Seattle, WA (US); Max Jesse Wishman, Seattle, WA (US); Christopher Nathan Watson, Seattle, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 127 days.

(21) Appl. No.: 15/281,816

(22) Filed: Sep. 30, 2016

(51) Int. Cl.
| | |
|---|---|
| *G06F 12/00* | (2006.01) |
| *G06F 3/06* | (2006.01) |
| *G06F 1/3287* | (2019.01) |
| *G06F 1/3234* | (2019.01) |
| *G06F 1/3225* | (2019.01) |
| *G11C 16/34* | (2006.01) |
| *G11C 29/04* | (2006.01) |

(52) U.S. Cl.
CPC .......... *G06F 3/0625* (2013.01); *G06F 1/3225* (2013.01); *G06F 1/3275* (2013.01); *G06F 1/3287* (2013.01); *G06F 3/0634* (2013.01); *G06F 3/0659* (2013.01); *G06F 3/0679* (2013.01); *G11C 16/3404* (2013.01); *G11C 2029/0409* (2013.01)

(58) Field of Classification Search
CPC . G06F 1/30; G06F 1/32; G06F 1/3203; G06F 1/263; G06F 1/266; G06F 1/28; G06F 1/3206; G06F 1/3268; G06F 1/3275; G06F 1/3296

USPC .......................................................... 711/103
See application file for complete search history.

(56) References Cited

U.S. PATENT DOCUMENTS

| | | | |
|---|---|---|---|
| 6,418,002 B1* | 7/2002 | Yang | G06F 1/28 361/18 |
| 2010/0332860 A1* | 12/2010 | Trantham | G06F 1/263 713/300 |
| 2014/0258755 A1* | 9/2014 | Stenfort | G06F 1/30 713/323 |

(Continued)

FOREIGN PATENT DOCUMENTS

| | | | | |
|---|---|---|---|---|
| CN | 106326061 | | 1/2017 | |
| CN | 106326061 A | * | 1/2017 | .......... H04L 41/069 |

*Primary Examiner* — Mardochee Chery
(74) *Attorney, Agent, or Firm* — Thomas | Horstemeyer, LLP; Michael J. D'Aurelio; Jason M. Perilla

(57) ABSTRACT

Aspects of dislocated charge storage for power loss protection in non-volatile memory systems are described. A system includes a power supply having an output power stage with bulk capacitance to supply power for a period of time after a power supply failure. The system also includes a network storage interface device and a non-volatile memory media card both coupled to the power supply for power. The power supply is configured to generate a power loss alert in response to the power supply failure. In turn, the network storage interface device is configured to perform a power loss data protection procedure with the non-volatile memory media card based on the power loss alert and during the period of time that the bulk capacitance can supply power after the power supply failure. The additional capacitance typically needed for power loss protection features is located apart from the non-volatile memory media cards.

20 Claims, 4 Drawing Sheets

(56) References Cited

U.S. PATENT DOCUMENTS

| | | | |
|---|---|---|---|
| 2015/0121137 A1* | 4/2015 | McKnight | G06F 1/30 714/15 |
| 2017/0090538 A1* | 3/2017 | Wang | G11C 5/14 |
| 2017/0149925 A1 | 5/2017 | Yang et al. | |
| 2017/0185335 A1* | 6/2017 | Pardoe | G06F 1/30 |

* cited by examiner

US 10,346,072 B1

DISLOCATED POWER LOSS PROTECTION CHARGE STORAGE

BACKGROUND

Storage devices, servers, and other systems can provide data storage for various types of data files. Such storage systems can include specially-designed hardware and/or software components for certain storage requirements or applications, such as long-term data backup, data redundancy, remote file sharing, or other applications.

For storing data, data storage systems can include one or more memory drives arranged in any suitable configuration based on storage requirements or needs. As one example, a data storage device systems can include solid-state memory devices. Flash memory is an example non-volatile solid-state storage medium that can be electrically erased and reprogrammed.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
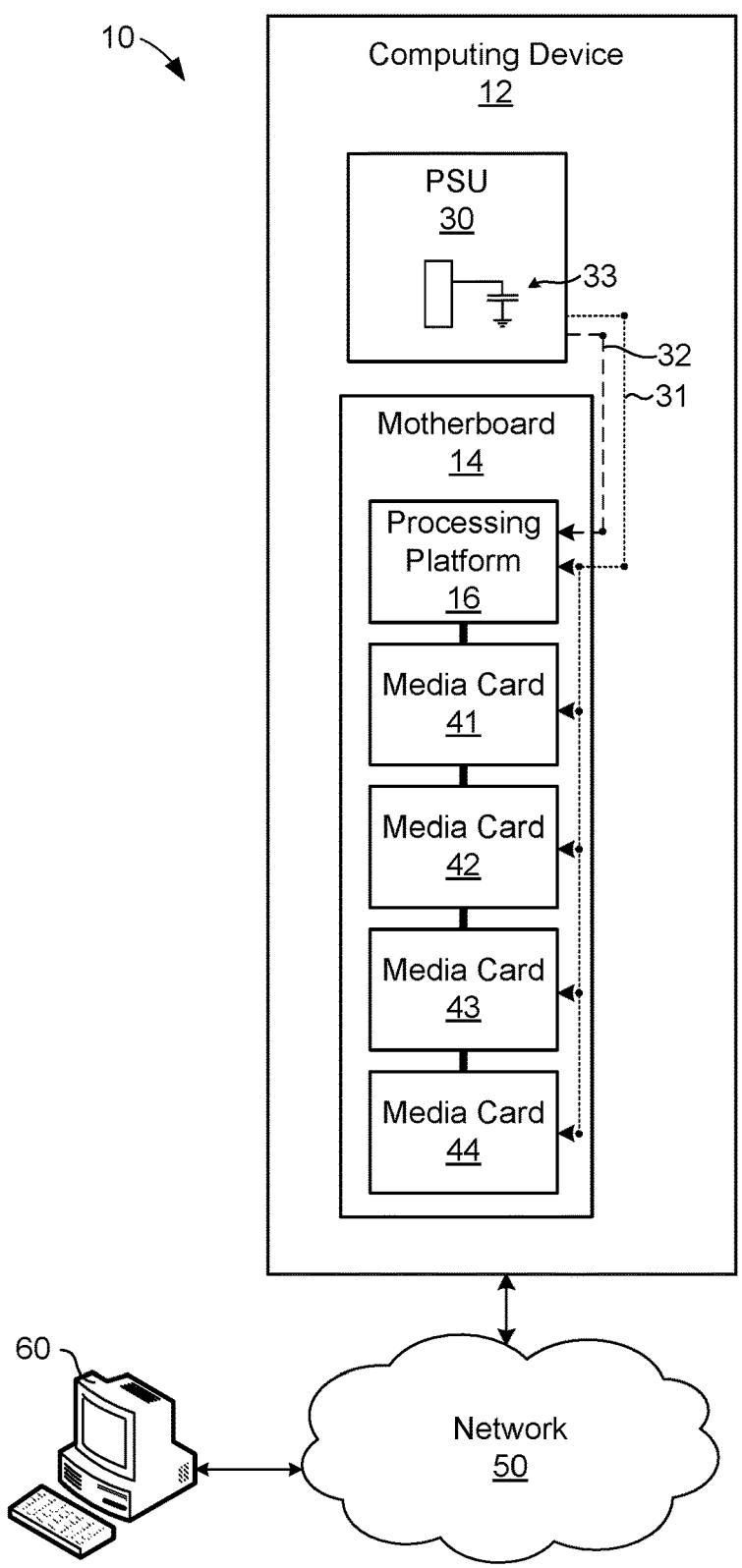
FIG. 1 illustrates a networked environment with a network storage system incorporating dislocated power loss protection charge storage according to various example embodiments described herein.

As noted above, storage devices, servers, and other systems can include one or more memory drives arranged into any suitable logical configuration. In some cases, storage systems can include solid-state memory devices. Flash memory is an example of a non-volatile solid-state storage medium that can be electrically erased and reprogrammed. Solid-state drive (SSD) manufacturers can use certain arrangements of flash memory cells to enhance read or write performance for certain applications or based on other factors. Some SSDs use multi-level cell (MLC) flash memory cells that rely upon multiple floating gate charge levels to store a number of bits of data in one memory cell.

SSD drives generally include a controller that interfaces the flash memory arrays within the SSD drives to a physical interface of the SSD for connection to a host computer. The controller can be embodied as an embedded processor or processing circuit. The controller can include a processor that executes firmware (e.g., human-written instructions complied into computer-readable instructions), for example, to perform various functions in an SSD drive. Examples of the types of functions that can be performed by the controller include bad block mapping, read and write caching, encryption, error detection and correction, garbage collection, read scrubbing and read disturb management, wear leveling, and power loss data protection.

SSD drives (and particularly enterprise-level SSD drives) can incorporate a charge store, such as one or more capacitors, to store energy for power loss protection features. The stored energy can be used to perform certain power loss data protection procedures in the event that the SSD drive experiences a power loss event. During SSD operations, data is often stored temporarily in a volatile cache memory (e.g., dynamic random access memory (DRAM), static random access memory (SRAM), etc.) to reduce the performance gap between the host computer and the flash memory array. However, the volatile cache memory cannot retain data during power loss events. In a normal power-off process, data from the cache is flushed to the flash memory array along with the latest metadata. In the case of an unexpected power loss event, on the other hand, the flushing process cannot be completed and data loss can occur without the additional energy stored in capacitors on the SSD drives.

In the context outlined above, computing devices that incorporate additional bulk capacitance in the power supplies of the computing devices and the use of that additional bulk capacitance for power loss protection procedures are described. One goal of the designs is to offload the capacitance typically needed to supply power for power loss data protection features from within the non-volatile memory media cards or drives to the power supplies for the computing devices themselves.

In one example, a system includes a power supply having an output power stage with bulk capacitance sufficient to supply power for a period of time after a failure of the power supply. The system also includes a network storage interface device and a non-volatile memory media card both coupled to the power supply for power. The power supply generates a power loss alert to warn the network storage interface device of a critical power-supply-related issue, such as loss of power or impending shutdown due to over-voltage, over-current, or over-temperature conditions, for example. The network storage interface device directly receives the power loss alert from the power supply and, in turn, performs a power loss data protection procedure with the non-volatile memory media card. The power loss protection procedure is performed in response to the power loss alert and during the period of time that the bulk capacitance of the power supply can supply power after the power supply failure.

According to the concepts described herein, the additional capacitance typically needed for power loss protection features can be located at the power supply of the computing device and apart from non-volatile memory media cards or drives. Even without the capacitance typically needed at the non-volatile memory media cards, network storage devices can still achieve the same or similar power loss protection features as enterprise-level SSD drives.

To provide additional context for a discussion of the concepts introduced above, FIG. 1 illustrates a networked environment 10 with a computing device 12 that incorporates dislocated power loss protection charge storage. As shown in FIG. 1, the computing device 12 includes a power supply unit (PSU) 30 and a motherboard 14. The motherboard 14 includes a processing platform 16 and media cards 41-44 communicatively coupled to the processing platform 16 over a backplane. The networked environment 10 also includes a network 50 and a computing device 60 that is communicatively coupled to the computing device 12.

Among other components, the processing platform 16 can include a central processing unit (CPU), random access memory (RAM), and the supporting chipset to interface the CPU with the RAM, the media cards 41-44, and other components on the motherboard 14. The media cards 41-44 include non-volatile memory arrays, such as flash memory arrays. The processing platform 16 and the media cards 41-44 are communicatively coupled together over a backplane, such as a peripheral component interconnect express (PCIe) bus backplane, for example, although they can be coupled together using other suitable on- and/or between-board local interfaces.

The PSU 30 provides power to the motherboard 14, which is then distributed to the processing platform 16 and the media cards 41-44. In the event of a power failure, the PSU 30 provides a power loss alert or power loss alert signal to the processing platform 16 over a management bus 32. The management bus 32 can be embodied as a system management bus (SMBus), for example, or other related management bus. The PSU 30 also includes a bulk capacitance 33 to supply power to the components of the motherboard 14 for at least a period of time in the event of a failure of the PSU 30. As described in further detail below with reference to the example shown in FIG. 2, a power loss failure can occur at the PSU 30 for a variety of reasons.

The media cards 41-44 include non-volatile memory arrays but not (in at least one embodiment) a charge store (e.g., capacitor or bank of capacitors) designated for the particular purpose of storing energy for power loss data protection. Thus, in the event that the supply of power to the motherboard 14 over the power bus 31 were to suddenly fail (e.g., be lost, droop outside specifications, dropout, etc.) without remedial or power loss data protection actions being taken on the motherboard 14, one or more of the media cards 41-44 might experience a data loss event. Thus, if the supply of power to the motherboard 14 were to suddenly fail, data temporarily stored in the processing platform 16 for transfer to the media cards 41-44, for example, might be lost before it is stored in the media cards 41-44.

To avoid the loss of data in the computing device 12, the PSU 30 generates a power loss alert over the management bus 32 in response to a failure (or imminent failure) of the PSU 30. Even after the PSU 30 generates the power loss alert over the management bus 32, it is still capable of supplying power to the motherboard 14 for a limited period of time because of the bulk capacitance 33. Thus, when the processing platform receives the power loss alert over the management bus 32, it can perform a power loss protection procedure with one or more of the media cards 41-44. The power loss protection procedure is performed in response to the power loss alert over the management bus 32 and during the period of time that the bulk capacitance 33 of the PSU 30 can supply power after the failure of the PSU 30. Thus, the need for additional capacitance for power loss protection features on the motherboard 14 or in the media cards 41-44 can in some cases be eliminated or, at least to a significant degree, reduced.

Figure 2:
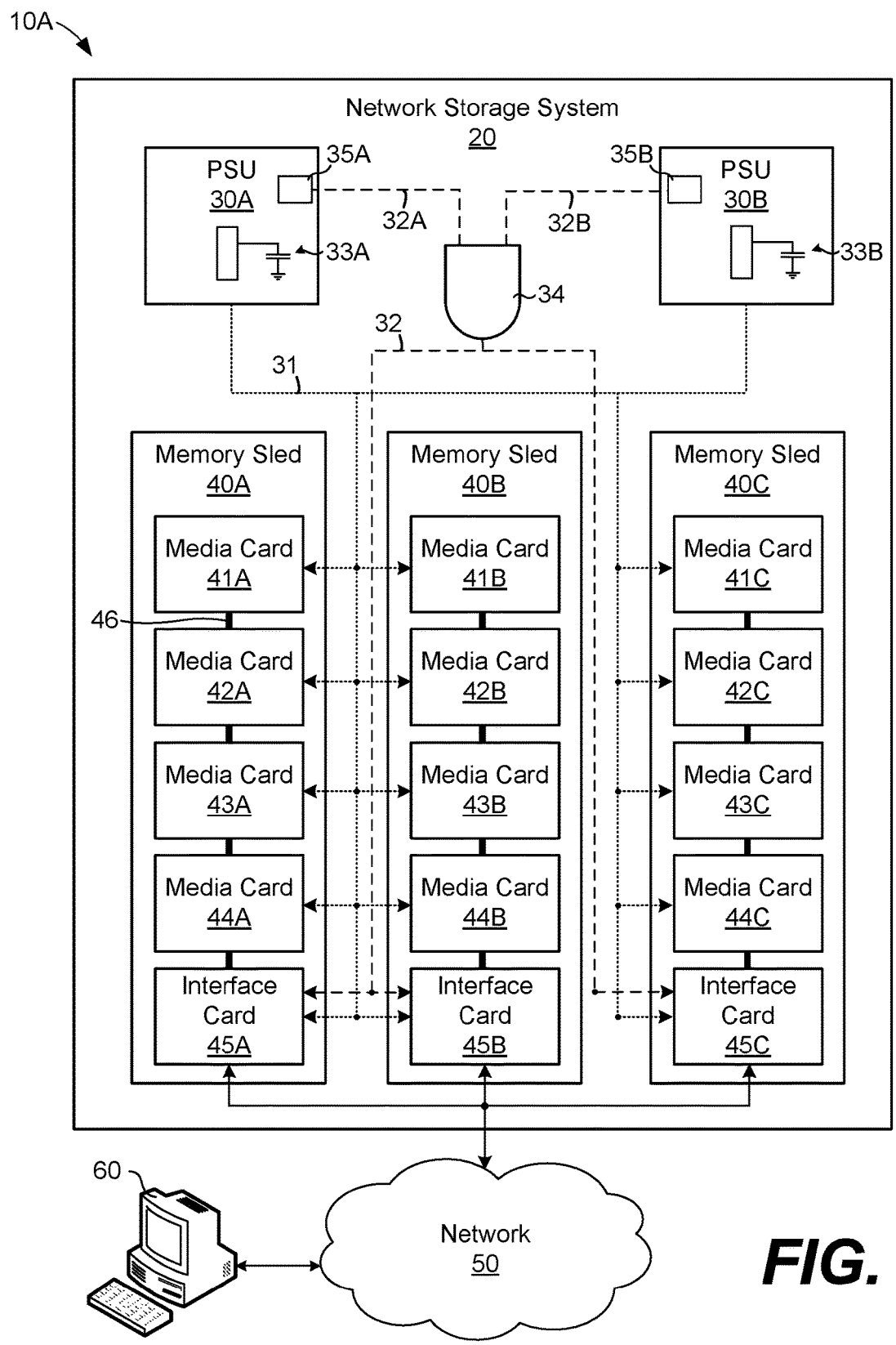
FIG. 2 illustrates a network storage system according to another example embodiment described herein.

Turning to other examples, FIG. 2 illustrates a networked environment 10A including a network storage system 20 according to another example embodiment described herein. The network storage system 20 includes PSUs 30A and 30B and memory sleds 40A-20C. The memory sled 40A includes media cards 41A-44A and an interface card 45A, the memory sled 40B includes media cards 41B-44B and an interface card 45B, and the memory sled 40C includes media cards 41C-44C and an interface card 45C.

The supply of power from the PSUs 30A and 30B are combined over the power bus 31, which provides power to the memory sleds 40A-40C. Further, one or more control signals from the management bus 32A of the PSU 30A and one or more control signals from the management bus 32B of the PSU 30B are provided as inputs to the logic circuitry 34. The output of the logic circuitry 34 forms the management bus 32 which is coupled to the interface cards 45A, 45B, and 45C. A control signal on the management bus 32 can alert the interface cards 45A, 45B, and 45C that a power failure is about to occur as described below. In one example case, a processing device (e.g., SoC processor, etc.) on each of the interface cards 45A, 45B, and 45C includes an input/output pin electrically coupled to the management bus 32.

Before turning to a more detailed description of the individual components in the network storage system 20, it is noted that the configuration shown in FIG. 2 is provided as a representative example of one in which dislocated charge storage can be used for power loss protection. For example, the network storage system 20 can include a greater or fewer number of PSUs, memory sleds, media cards, interface cards, etc. Thus, the concepts of dislocated power loss protection charge storage described herein can be applied to other configurations of network storage (and other similar) systems.

The PSUs 30A and 30B can be embodied as any suitable type(s) of power supplies capable of converting alternating current (AC) line voltages, for example, to regulated low-voltage direct current (DC) power for the components of the network storage system 20. The PSUs 30A and 30B can include power conversion circuitry including one or more transformers, linear regulators, isolated or non-isolated switched-mode regulators, other power converting circuitry, and combinations thereof. The power conversion circuitry can be designed to output one or more power rails at various voltages, such as 3.3V, 5V, 12V, −12V, etc.

The total power requirements for the network storage system 20 can range depending upon the demands of the network storage system 20 (e.g., from more or less than about 50 W to more or less than about 1000 W). Each of the PSUs 30A and 30B can be designed to supply a greater amount of power than needed by the network storage system 20 under full load for safety and reliability purposes, and the PSUs 30A and 30B can be used together in the network storage system 20 for redundancy.

Each of the memory sleds 40A-40C can be embodied as a logical unit of data storage in the network storage system 20, and the network storage system 20 can include additional or fewer memory sleds. The media cards 41A-44A in the memory sled 40A can be embodied as a printed circuit board or other media card having a number of solid-state non-volatile memory chips electrically coupled thereto. In that context, the media cards 41A-44A can include any suitable number of flash memory chips or modules based on any flash technology (e.g., NAND, NOR, MLC, etc.). In other cases, the media cards 41A-44A can include other types of non-volatile memories including magnetoresistive random access (MRAM), ferroelectric random access (FRAM), other types of memories, or combinations thereof. The media cards 41B-44B and 41C-44C are similar in form and function as the media cards 41A-44A.

The interface card 45A can include one or more general- or specific-purpose processors, processing circuits, processing modules, etc., with memory, capable of performing or executing logical operations on data. Among other types of processors, the interface card 45A can include a system on chip (SoC) processor, embedded processor, other type of processor, or combinations thereof. The processors can be directed by firmware or the execution of computer-readable instructions stored on a memory device to perform or implement various functions or functional modules described herein. For example, as described in further detail below with reference to FIG. 3, the processors in the interface card 45A can perform various functions including those of a memory controller and power loss manager. As also discussed below, the interface card 45A can also include one or more physical layer communications interfaces to communicate data over the network 50.

The interface card 45A can also include a cache memory to operate as an intermediate storage location for data provided to the network storage system 20 from the computing device 60 before it is stored in the media cards 41A-44A. The cache memory, which is described in further detail below with reference to FIG. 3, can be a volatile memory cache, such as a DRAM, SRAM, etc. In operation, the interface card 45A can be configured to receive data transfer instructions and data over the network 50 from the computing device 60 and store that data, at least temporarily, in the cache memory based on the data transfer instructions. The interface card 45A can also translate the data transfer instructions received over the network 50 into data access commands. The interface card 45A can use the data access commands to access (e.g., read from, write to, etc.) the non-volatile memories in the media cards 41A-44A.

As compared to many commercially-available non-volatile SSD drives, the memory sled 40A does not include a charge store (e.g., capacitor or bank of capacitors) designated for the particular purpose of storing energy for power loss data protection on the memory sled 40A. Similarly, the memory sleds 40B and 40C do not include a designated charge store for power loss data protection functions. Instead, all charge storage for data loss protection has been effectively offloaded or transferred to the PSUs 30A and 30B based on the design of the network storage system 20 as discussed below.

Data and data transfer commands can be communicated between the computing device 60 and the interface card 45A (and the interface cards 45B and 45C) over the network 50 using any suitable interface specification and protocol. As one example, the data and data transfer commands can be communicated over the network 50 using a type of packet-based virtualized or abstracted MDME interface, although other interface specifications can be used. Further, the data access commands can be communicated between the interface card 45A and the media cards 41A-44A over a backplane 46 using any suitable interface specification and protocol. For example, the NVM express (NVMe) or non-volatile memory host controller interface specification (NVMHCI) can be used over the backplane 46 although other interface specifications can be used. Thus, in one example case, the backplane 46 can be embodied as a PCIe bus between the interface card 45A and the media cards 41A-44A. However, other suitable physical and logical interfaces can be used between the interface card 45A and the computing device 60 and between the interface card 45A and the media cards 41A-44A. The backplane 46 can also be embodied, at least in part, as an off-board solution such as a cable harness.

The backplane 46 of the memory sled 40A can be omitted in some embodiments. In that case, the processors, cache memory, and other components on the interface card 45A and the non-volatile memory chips on the media cards 41A-44A can be coupled together with other types of local interfaces. In one example, the components on the interface card 45A and the media cards 41A-44A can be mounted and electrically coupled together on a single printed circuit board. However connected in the memory sled 40B, the media cards 41B-44B can be similar in form and function to the media cards 41A-44A, and the interface card 45B can be similar in form and function to the interface card 45A. Similarly, the media cards 41C-44C can be similar in form and function to the media cards 41A-44A, and the interface card 45C can be similar in form and function to the interface card 45A.

The network 50 can include the Internet, intranets, extranets, wide area networks (WANs), local area networks (LANs), wired networks, wireless (e.g., cellular, 802.11-based (WiFi), bluetooth, etc.) networks, cable networks, satellite networks, other suitable networks, or any combinations thereof. Although not illustrated, the network 50 can include connections to any number of network hosts, such as website servers, file servers, networked computing resources, databases, data stores, or any other network or computing architectures.

The computing device 60 is representative of one or more computing devices that can transfer data to and receive data from the network storage system 20. In that context, the computing device 60 can be embodied as any type of computing device, processing circuit, or processor-based device or system, including those embodied in the form of a desktop computer, a laptop computer, a personal digital assistant, a cellular telephone, or a tablet computer, among others.

The functions performed by each of the interface cards 45A, 45B, and 45C are similar and are described in further detail below with reference to FIG. 3. As an introduction to those functions, the interface card 45A is configured to receive data transfer instructions and data from the computing device 60 over the network 50 (and to transmit data to the computing device 60 over the network 50). As an intermediate stage when data is received, the interface card 45A stores the data from the computing device 60 in the local cache memory area on the interface card 45A. The local cache memory, which is described in further detail below with reference to FIG. 3, can be a volatile memory cache, such as a DRAM, SRAM, etc.

The interface card 45A also interprets the data transfer instructions received from the computing device 60 and translates them into data access commands for the media cards 41A-44A. Just like the data transfer instructions can include data read, write, and other instructions, the data access commands can include data read, write, erase, and other types of commands (but in different form) to direct the operation of the media cards 41A-44A. As one example, the data access commands can instruct one or more of the media cards 41A-44A to store certain data from the local cache memory area on the interface card 45A into non-volatile memory chips on the media cards 41A-44A. In that way, the data received from the computing device 60 can be temporarily stored in the local cache memory area on the interface card 45A and, later, moved into non-volatile memory chips on the media cards 41A-44A for persistent storage. That data transfer process can continue over time in all the memory sleds 40A, 40B, and 40C.

At some time, one or both of the PSUs 30A and 30B may experience a failure for various reasons. The reliability of a PSU can be specified in terms of the mean time between failures (MTBF), where higher MTBF ratings indicate longer life and increased reliability. Using high quality components or better cooling can lead to a higher MTBF rating, for example, although other factors have a bearing on MTBF. If one or both of the PSUs 30A and 30B experience a failure, the power supplied over the power bus 31 can drop out. To reduce the chances of a power failure in network storage system 20, the PSUs 30A and 30B are both coupled to the power bus 31. The use of both the PSUs 30A and 30B rather than a single PSU offers an amount of redundancy for the network storage system 20. In general, any number of PSUs can be relied upon based on factors including reliability, cost, volume constraints, etc.

The PSUs 30A and 30B each include a controller 35A and 35B, respectively. The controllers 35A and 35B can be embodied as specialized embedded microcontrollers other types of processing circuits to monitor the operating characteristics of the PSUs 30A and 30B, respectively. The controllers 35A and 35B are configured to monitor the overall operations of the PSUs 30A and 30B and to detect various conditions related to failures, such as disturbances or out-of-specification voltages on certain rails. The controllers 35A and 35B can also identify a loss of main or line voltages fed to the PSUs 30A and 30B or other conditions that will result in a failure of power on the power bus 31. Based on the operating conditions of the PSUs 30A and 30B, the controllers 35A and 35B can output control signals on the management buses 32A and 32B, for example. The management bus 32A can include one or more physical or logical channels of a power management bus (PMBus), system management bus (SMBus), or other signaling bus.

As shown in FIG. 2, the PSU 30A includes a bulk capacitance 33A to supply power for at least a period of time after a failure of the PSU 30A. Similarly, the PSU 30B also includes a bulk capacitance 33B to supply power for at least a period of time after a failure of the PSU 30B. More particularly, the bulk capacitances 33A and 33B can supply power for a period of time after the controllers 35A and 35B, respectively, output power loss control signals on the management buses 32A and 32B. The period of time can be predetermined with some level of accuracy in some cases based on the amount of the bulk capacitance 33A and the current or average power draw of the network storage system 20 under various conditions. In the context of power failures or power losses, a failure of either the PSUs 30A or 30B can be caused by component(s) failure(s), a loss of main or line voltages, or other conditions that result in a failure of power on the power bus 31. The bulk capacitances 33A and 33B can be selected to be of suitable size to supply power for a period of time after a failure of either the PSUs 30A or 30B, such as for 5, 10, 15, 20, or more milliseconds, for example, although other periods of time are within the scope of the embodiments.

In the example shown in FIG. 2, control signals on the management bus 32A and the management bus 32B are logically "ANDed" together by the logic circuitry 34. The control signal output from the logic circuitry 34 is provided on the management bus 32 to the interface cards 45A, 45B, and 45C. Using the logic circuitry 34, the interface cards 45A, 45B, and 45C are only alerted to a power loss "logic true" signal level on the management bus 32 if both the PSUs 30A and 30B output logic true levels on the management buses 32A and 32B. Thus, the interface cards 45A, 45B, and 45C are only alerted to a power loss condition if both the PSUs 30A and 30B experience a failure.

In response to a power loss alert received over the management bus 32, the interface cards 45A, 45B, and 45C are each configured to perform a power loss data protection procedure. The power loss data protection procedure includes certain tasks to reduce or, potentially, eliminate any loss of data in the memory sleds 40A, 40B, and 40C before the residual or remaining power in the bulk capacitances 33A and 33B expires. Primarily, the power loss data protection procedure seeks to offload (i.e., transfer) any data remaining in volatile cache memory on the interface cards 45A, 45B, and 45C to non-volatile memory areas on the media cards 41A-44A, 41B-44B, and 41C-44C. In some cases as described below with reference to FIG. 3, one or more memory areas in the media cards 41A-44A, 41B-44B, and 41C-44C can be designated specifically for data and metadata transfer during power loss data protection procedures.

By design of the network storage system 20, all power loss data protection procedures can be completed (or at least substantially completed) on the memory sleds 40A, 40B, and 40C during the period of time that one or both of the bulk capacitances 33A and 33B can supply power after a power loss alert is provided over the management bus 32. In that way, even without power loss data protection procedure capacitance on the memory sleds 40A, 40B, and 40C, the bulk capacitances 33A and 33B can supply power until all (or nearly all) remaining data (and any flash storage metadata) is transferred from volatile memory areas on the interface cards 45A, 45B, and 45C to non-volatile memory areas on the media cards 41A-44A, 41B-44B, and 41C-44C.

Figure 3:
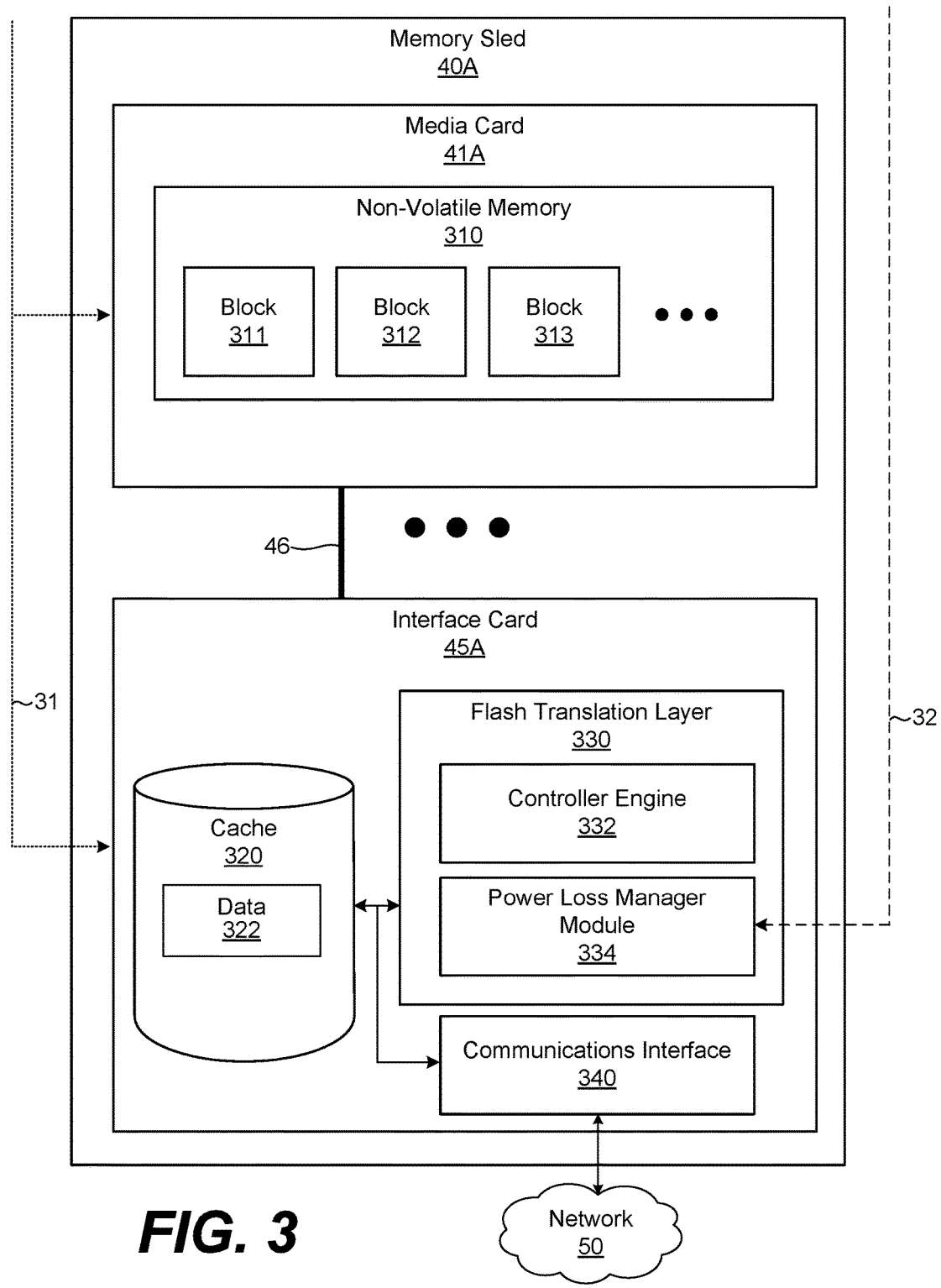
FIG. 3 further illustrates components of the network storage system shown in FIG. 2 according to various example embodiments described herein.

FIG. 3 further illustrates components of the network storage system 20 shown in FIG. 1. To focus the description, FIG. 3 illustrates certain components of the media card 41A and the interface card 45A in the memory sled 40A. The media card 41A includes the non-volatile memory 310, which includes memory blocks 311, 312, and 313, among others. Among other components, the interface card 45A includes a volatile cache memory 320 that stores data 322, a flash translation layer 330, and a communications interface 340. The flash translation layer 330 includes a controller engine 332 and a power loss manager module 334.

The communications interface 340 can be embodied as any suitable network interface including physical layer receiver and transmitter circuitry to communicate data over the network 50, regardless of the protocol used. In various embodiments, the communications interface 340 can be dedicated for use by the interface card 45A and/or the memory sled 40A, but can be shared among the memory sleds 40B and 40C in some cases.

The volatile cache memory 320 can be embodied as DRAM, SRAM, etc. and is used to temporarily store the data 322 before (or after) it is transferred to (or from) the non-volatile memory 310 over the backplane 46. The flash translation layer 330 can be embodied as a functional module of an SoC or other type of processor or processing circuit. In that context, the flash translation layer 330 can be also embodied, at least in part, as firmware or executable computer-readable instructions embodied in or executed by the SoC or other processor.

The controller engine 332 can be configured to perform various memory-storage-related functions for the memory sled 40A. The functions can be particularly related to the memory operations on the media card 41A. Examples of the types of functions that can be performed by the controller engine 332 include bad block mapping, read and write caching, encryption, error detection and correction, garbage collection, read scrubbing and read disturb management, wear leveling, and power loss data protection, among others. The power loss manager module 334 can be configured to develop and perform power loss data protection procedures. Examples of those procedures are described in further detail below.

The controller engine 332 is also configured to interpret data transfer instructions received over the network 50 and translate them into data access commands to instruct the non-volatile memory 310. Just like the data transfer instructions can include data read, write, and other instructions, the data access commands can include data read, write, erase, and other types of commands (but in different form) to direct the operation of the non-volatile memory 310. As one example, the data access commands can instruct the non-volatile memory 310 to store certain data from the volatile cache memory 320 into one or more of the non-volatile memory blocks 311-313. In that way, the data 322 can be temporarily stored in the volatile cache memory 320 and, later, moved into non-volatile memory chips on the media card 41A, for example, for persistent storage.

In response to a power loss alert received over the management bus 32, the interface card 45A (e.g., the SoC on the interface card 45A) can be interrupted to direct processes of the power loss manager module 334. The power loss manager module 334 can then perform certain tasks to reduce or eliminate any loss of data in the volatile cache memory 320 before the residual or remaining power in the bulk capacitances 33A and 33B (FIG. 2) is expired. Primarily, the power loss data protection procedure seeks to offload (i.e., transfer) any data remaining in volatile cache memory 320 to one or more of the non-volatile memory areas or blocks 311-313. In some cases, one or more of the blocks 311-313 can be designated specifically for data and metadata transfer during power loss data protection procedures.

More particularly, in response to a power loss alert received over the management bus 32, the power loss manager module 334 ensures that all data stored in the volatile cache memory 320 associated with any host write request (i.e., from the computing device 60 in FIG. 2) of successful completion status is preserved across the power loss event. The power loss manager module 334 can also ensure that all metadata structures required for a coherent rebuild of the indirection map, for example, are also preserved. Each time a power loss alert is detected over the management bus 32, the power loss manager module 334 can create and store a power loss snapshot (PLS) in the media card 41A, among other logical storage units. A PLS can be comprised of indirection map metadata, logging data, and data acknowledged as being stored-complete. The PLS can be saved to one or more special blocks in the non-volatile memory 310 reserved for this purpose.

Figure 4:
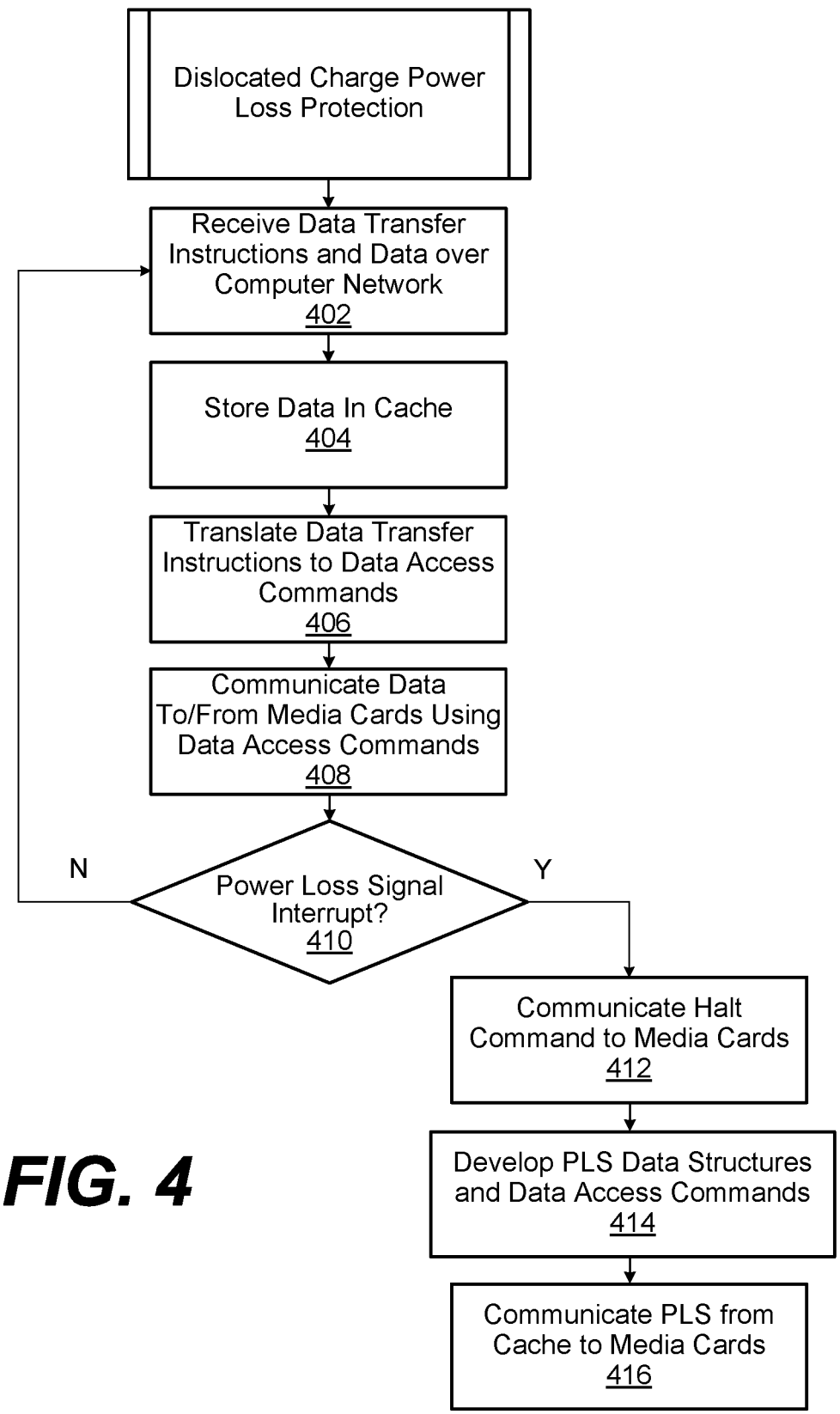
FIG. 4 illustrates a process of dislocated charge power loss protection that can be performed by the systems shown in FIGS. 1-3 according to an example embodiment described herein.

FIG. 4 illustrates a process of dislocated charge power loss protection performed by the network storage system shown in FIGS. 1-3 according to an example embodiment described herein. The process flowchart in FIG. 4 can be viewed as depicting an example set of steps performed in the network storage system 20. The flowchart in FIG. 4 provides merely one example of a functional sequence or arrangement of steps that can be employed to implement the operations of dislocated charge power loss protection described herein, and other sequences of steps are within the scope of the embodiments. Further, although the process below is generally described in connection with the interface card 45A in the memory sled 40A of the network storage system 20, other interfaces and systems can perform the process.

At reference numeral 402, the process includes the interface card 45A receiving a data transfer instruction and data over the network 50. At reference numeral 404, the process includes the controller engine 332 of the interface card 45A temporarily storing the data in the volatile cache memory 320. At reference numeral 406, the process includes the controller engine 332 translating the data transfer instruction received at reference numeral 402 to a data access command to interface with the non-volatile memory 310.

In an ongoing manner, at reference numeral 408, the process includes the controller engine 332 communicating data to and from the non-volatile memory 310, for example, among other the non-volatile memories in the memory sled 40A based on various data access commands over the backplane 46. Here, various data read and write operations can occur between the interface card 45A and the non-volatile memory 310.

At reference numeral 410, the process includes determining whether the interface card 45A (e.g., the SoC on the interface card 45A) has been interrupted. As described above, the interruption can be based on or in response to a power loss alert received over the management bus 32 from the PSUs 30A and 30B. If so, then the process proceeds to reference numeral 412. Otherwise, if the interface card 45A has not been interrupted, then the process proceeds back to reference numeral 402 to receive (or transmit) data over the network 50.

At reference numeral 412, the process includes the power loss manager module 334 communicating a halt command to the media cards 41A-44A in the memory sled 40A. The halt command should halt the current operations on the media cards 41A-44A, so they can be prepared to receive a PLS. At reference numeral 414, the process includes the power loss manager module 334 developing power loss protection data structures such as those discussed above in the PLS, as well as any data access commands to instruct one or more of the media cards 41A-44A to store the PLS. At reference numeral 416, the process includes the power loss manager module 334 communicating the PLS to one or more of the media cards 41A-44A for storage.

As described herein, the operations performed at reference numerals 412, 414, and 416 can occur during and preferably within the period of time before the residual or remaining power in the bulk capacitances 33A and 33B of the PSUs 30A and 30B expires. In other words, those operations can optimally occur between the determination of a power loss interrupt even at reference numeral 410 and the communication of the PLS to the media cards 41A-44A for storage at reference numeral 416. As discussed above, the memory sled 40A does not include a charge store (e.g., capacitor or bank of capacitors) designated for the particular purpose of storing energy for power loss data protection on the memory sled 40A. Similarly, the memory sleds 40B and 40C do not include a designated charge store for power loss data protection functions. Instead, all charge storage for data loss protection has been effectively offloaded or transferred to the PSUs 30A and 30B based on the design of the network storage system 20.

In various embodiments, interface cards 45A-45C can store computer-readable software instructions for execution by one or more processors or processing circuits. Additionally or alternatively, the one or more processors or processing circuits in the interface cards 45A-45C can be directed by firmware. The terms "executable" or "for execution" refer to software forms that can ultimately be run or executed by processors or processing circuits, whether in source, object, machine, or other form. Examples of executable programs include, for example, a compiled program that can be translated into a machine code format, source code that can be expressed in an object code format, or source code that can be interpreted by another executable program to generate instructions for execution.

Computer-readable software instructions can be stored on any physical media such as, for example, magnetic, optical, or semiconductor media. More specific examples of suitable computer-readable media include, but are not limited to, magnetic tapes, magnetic floppy diskettes, magnetic hard drives, memory cards, solid-state drives, USB flash drives, optical discs, SRAM, DRAM, or MRAM. In addition, the computer-readable medium may include a ROM, a PROM, an EPROM, an EEPROM, or other similar memory device.

The flowchart or process diagram in FIG. 4 is representative of certain processes, functionality, and operations of the embodiments discussed herein. Each block can represent one or a combination of steps or executions in a process. Alternatively or additionally, each block can represent a module, segment, or portion of code that includes program instructions to implement the specified logical function(s). The program instructions can be embodied in the form of source code that includes human-readable statements written in a programming language or machine code that includes numerical instructions executable by a suitable execution system. The machine code can be converted from the source code, etc. Further, each block can represent, or be connected with, a circuit or a number of interconnected circuits to implement a certain logical function or process step.

Although the flowchart or process diagram in FIG. 4 illustrates a certain order or flow, it is understood that the order can differ from that which is depicted. For example, an order of execution of two or more blocks can be scrambled relative to the order shown. Also, two or more blocks shown in succession in FIG. 4 can be executed concurrently or with partial concurrence. Further, in some embodiments, one or more of the blocks shown in FIG. 4 can be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Disjunctive language, such as the phrase "at least one of X, Y, or Z," unless specifically stated otherwise, is to be understood with the context as used in general to present that an item, term, etc., can be either X, Y, or Z, or any combination thereof (e.g., X, Y, and/or Z). Thus, such disjunctive language is not generally intended to, and should not, imply that certain embodiments require at least one of X, at least one of Y, or at least one of Z to be each present.

It should be emphasized that the above-described embodiments are merely examples to set forth an understanding of the principles and concepts of the disclosure. Many variations and modifications can be made to the above-described embodiment(s) without departing substantially from the spirit and principles of the disclosure. All such modifications and variations are intended to be included herein within the scope of this disclosure and protected by the following claims.

Therefore, at least the following is claimed:

1. A system, comprising:
   a power supply comprising a power supply controller and an output power stage having a bulk capacitance to supply power for at least a period of time after a power supply failure;
   a network storage interface device coupled to the power supply for power and configured to receive data over a computer network for storage; and
   a non-volatile memory media card coupled to the power supply for power, coupled to the network storage interface device over a backplane for data communications, and configured to perform a memory array access procedure based on a data access command from the network storage interface device, wherein:
   the power supply controller is configured to generate a power loss alert in response to the power supply failure; and
   the network storage interface device is configured, in response to the power loss alert, to:
   halt the memory array access procedure;
   develop a power loss protection data structure comprising indirection map metadata; and
   communicate with the non-volatile memory media card to transfer the power loss protection data structure to a power loss protection memory area in the non-volatile memory media card during the period of time that the bulk capacitance can supply power after the power supply failure.

2. The system of claim 1, wherein:
   the network storage interface device comprises a cache to store the data received over the computer network; and
   the network storage interface device is further configured to:
   communicate with the non-volatile memory media card during the memory array access procedure to transfer at least a portion of the data in the cache to a memory area in the non-volatile memory media card; and
   communicate a halt command to the non-volatile memory media card to halt the memory array access procedure in response to the power loss alert.

3. The system of claim 2, wherein the network storage interface device is further configured, based on the power loss alert, to:
   store the power loss protection data structure in the cache on the network storage interface device; and
   communicate with the non-volatile memory media card to transfer the power loss protection data structure from the cache on the network storage interface device to the power loss protection memory area in the non-volatile memory media card.

4. The system of claim 1, wherein a processor in the network storage interface device comprises an input/output pin electrically coupled to an output of a power management bus of the power supply to receive the power loss alert.

5. A system, comprising:
   a non-volatile memory media card coupled to a power supply for power; and
   a network storage interface device coupled to the power supply for power, coupled to the non-volatile memory media card for data communications, and configured, in response to a power loss alert received from the power supply, to:
   halt a memory array access procedure;
   develop a power loss protection data structure comprising indirection map metadata; and
   communicate with the non-volatile memory media card to transfer the power loss protection data structure to a power loss protection memory area in the non-volatile memory media card.

6. The system of claim 5, further comprising the power supply, the power supply comprising a power supply controller and an output power stage having a bulk capacitance to supply power to the non-volatile memory media card and the network storage interface device for at least a period of time after a power supply failure.

7. The system of claim 6, wherein the network storage interface device is configured to transfer the power loss protection data structure to the power loss protection memory area in the non-volatile memory media card during the period of time that the bulk capacitance can supply power after the power supply failure.

8. The system of claim 5, wherein the network storage interface device is further configured to:
receive a data transfer instruction and data over a computer network;
store the data in a cache on the network storage interface device; and
communicate with the non-volatile memory media card to transfer at least a portion of the data in the cache to a memory area in the non-volatile memory media card.

9. The system of claim 8, wherein, based on the power loss alert, the network storage interface device is further configured to communicate a halt command to the non-volatile memory media card to halt the memory array access procedure.

10. The system of claim 9, wherein, based on the power loss alert, the network storage interface device is further configured to:
store the power loss protection data structure in the cache on the network storage interface device; and
communicate with the non-volatile memory media card to transfer the power loss protection data structure from the cache on the network storage interface device to the power loss protection memory area in the non-volatile memory media card.

11. The system of claim 5, wherein:
the non-volatile memory media card comprises a plurality of non-volatile memory media cards; and
the network storage interface device is further configured, based on the power loss alert, to communicate a halt command to individual ones of the plurality of non-volatile memory media cards; and
communicate data to individual ones of the plurality of non-volatile memory media cards for storage in a power loss protection memory area in the individual ones of the plurality of non-volatile memory media cards.

12. The system of claim 11, further comprising a backplane between the network storage interface device and the plurality of non-volatile memory media cards.

13. The system of claim 5, wherein a processor in the network storage interface device comprises an input/output pin electrically coupled to an output of a power management bus of the power supply to receive the power loss alert.

14. The system of claim 5, wherein:
the power supply comprises a plurality of power supplies;
the system further comprises logic circuitry to combine an output from a power management bus of individual ones of the plurality of power supplies; and
a processor in the network storage interface device comprises an input/output pin electrically coupled to an output of the logic circuitry to receive the power loss alert.

15. A method, comprising:
receiving, by a processing device, a data transfer instruction and data over a computer network;
storing, by the processing device, the data in a cache based on the data transfer instruction;
translating, by the processing device, the data transfer instruction to a data access command for a non-volatile memory;
communicating, by the processing device, at least a portion of the data in the cache to a memory area in the non-volatile memory in a memory array access procedure using the data access command; and
in response to a power loss alert received from a power supply:
halting, by the processing device, the memory array access procedure;
developing, by the processing device, a power loss protection data structure comprising indirection map metadata; and
communicating, by the processing device, with the non-volatile memory to transfer the power loss protection data structure to a power loss protection memory area in the non-volatile memory during a period of time that a bulk capacitance in the power supply can supply power after receipt of the power loss alert.

16. The method of claim 15, wherein the power loss protection data structure further comprises logging data and data acknowledged by the processing device as being stored-complete.

17. The method of claim 16, wherein the communicating comprises communicating, by the processing device, the power loss protection data structure from the cache to the power loss protection memory area in the non-volatile memory.

18. The method of claim 15, wherein:
the non-volatile memory comprises a plurality of non-volatile memory media cards communicatively coupled to the processing device over a backplane; and
the method further comprises:
communicating, by the processing device, a halt command to individual ones of the plurality of non-volatile memory media cards; and
communicating, by the processing device, data to individual ones of the plurality of non-volatile memory media cards for storage in a power loss protection memory area in the individual ones of the plurality of non-volatile memory media cards.

19. The method of claim 15, wherein:
the power supply comprises a plurality of power supplies; and
the method further comprises combining an output from a power management bus of individual ones of the plurality of power supplies to generate the power loss alert.

20. The method of claim 15, wherein the processing device comprises an input/output pin electrically coupled to receive the power loss alert.

* * * * *